(12) United States Patent
Kim et al.

(10) Patent No.: US 8,778,731 B2
(45) Date of Patent: Jul. 15, 2014

(54) METHOD OF MANUFACTURING P-TYPE ZNO NANOWIRES AND METHOD OF MANUFACTURING ENERGY CONVERSION DEVICE

(71) Applicants: Samsung Electronics Co., Ltd., Suwon-si (KR); Industry-University Cooperation Foundation Hanyang University, Seoul (KR)

(72) Inventors: Hyun-jin Kim, Seongnam-si (KR); Young-jun Park, Suwon-si (KR); Sang-hyo Lee, Seoul (KR); Jin-pyo Hong, Seoul (KR); Jun-seok Lee, Seoul (KR)

(73) Assignees: Samsung Electronics Co., Ltd., Suwon-Si (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 13/667,668

(22) Filed: Nov. 2, 2012

(65) Prior Publication Data

US 2013/0112969 A1    May 9, 2013

(30) Foreign Application Priority Data

Nov. 3, 2011  (KR) .................. 10-2011-0114130
Oct. 25, 2012  (KR) .................. 10-2012-0119305

(51) Int. Cl.
*H01L 29/227*  (2006.01)
*H01L 29/06*  (2006.01)

(52) U.S. Cl.
CPC ........ *H01L 29/0676* (2013.01); *H01L 29/0665* (2013.01)
USPC ............. 438/104; 257/E21.464; 257/E29.098

(58) Field of Classification Search
CPC ................... H01L 29/0676; H01L 21/02603; H01L 29/0665; H01L 29/2003; H01L 41/113; H01L 41/18; H01L 21/02172; H01L 29/413; H01L 31/022483
USPC .......................... 257/43, E21.464; 438/104
See application file for complete search history.

(56) References Cited

U.S. PATENT DOCUMENTS

| | | | |
|---|---|---|---|
| 6,586,095 | B2 | 7/2003 | Wang et al. |
| 7,705,523 | B2 | 4/2010 | Wang et al. |
| 2009/0066195 | A1 | 3/2009 | Wang et al. |
| 2009/0115293 | A1* | 5/2009 | Wang et al. .................... 310/364 |
| 2010/0117488 | A1 | 5/2010 | Wang et al. |
| 2011/0084345 | A1 | 4/2011 | Park et al. |
| 2011/0101287 | A1 | 5/2011 | Takeda et al. |

* cited by examiner

*Primary Examiner* — Zandra Smith
*Assistant Examiner* — Paul Patton
(74) *Attorney, Agent, or Firm* — Sughrue Mion, PLLC

(57) ABSTRACT

A method of manufacturing silver (Ag)-doped zinc oxide (ZnO) nanowires and a method of manufacturing an energy conversion device are provided. In the method of manufacturing Ag-doped ZnO nanowires, the Ag-doped nanowires are grown by a low temperature hydrothermal synthesis method using a Ag-containing aqueous solution.

35 Claims, 9 Drawing Sheets

METHOD OF MANUFACTURING P-TYPE ZNO NANOWIRES AND METHOD OF MANUFACTURING ENERGY CONVERSION DEVICE

CROSS-REFERENCE TO RELATED APPLICATIONS

This application claims the benefit of Korean Patent Application No. 10-2011-0114130, filed on Nov. 3, 2011, and Korean Patent Application No. 10-2012-0119305, filed on Oct. 25, 2012, in the Korean Intellectual Property Office, the disclosures of which are incorporated herein in their entirety by reference.

BACKGROUND

1. Field

The present disclosure relates to a method of manufacturing ZnO nanowires and method of manufacturing an energy conversion device, and more particularly, to a method of manufacturing p-type zinc oxide (ZnO) nanowires doped with silver (Ag) and a method of manufacturing an energy conversion device using the p-type ZnO nanowire manufacturing method.

2. Description of the Related Art

As petroleum resources are depleting and concern about environmental pollution is growing, increasing attention is being directed towards development of eco-friendly renewable energy. Energy conversion devices using a piezoelectric effect are showing promise as pollution-free, repeatedly renewable energy conversion devices. These energy conversion devices are also gaining special attention due to their self-powered battery-free features. In particular, active research is being carried out regarding energy conversion devices using a piezoelectric effect of zinc oxide (ZnO) nanowires due to their easy synthesis and low cost. Such oxide semiconductor nanowires are gaining popularity in various fields including optical applications such as sensors, light-emitting devices, and solar cells and electronic devices due to their easy synthesis and excellent electrical and optical characteristics.

However, ZnO nanowires are generally formed of an n-type semiconductor material having a high carrier density. The high carrier density may screen a piezoelectric potential, resulting in a lower piezoelectric effect. Thus, in order to increase the piezoelectric effect, high temperature heat treatment needs to be artificially performed on ZnO nanowires after fabrication. Furthermore, to generate energy by using the ambient environment, an energy conversion device using ZnO nanowires has to be fabricated on a flexible substrate such as a plastic substrate. However, it is difficult to fabricate an energy conversion device on a flexible substrate because the ZnO nanowires are subjected to high temperature heat treatment.

SUMMARY

Various embodiments provide methods of manufacturing zinc oxide (ZnO) nanowires doped with silver (Ag) and methods of manufacturing an energy conversion device using the ZnO nanowire manufacturing method.

According to an aspect of an embodiment, there is provided a method of manufacturing silver (Ag)-doped ZnO nanowires, the method including growing the Ag-doped ZnO nanowires on a substrate by a low temperature hydrothermal synthesis method using an Ag-containing aqueous solution.

The growing the Ag-doped ZnO nanowires may include: preparing the aqueous solution containing Ag salt, Zn salt, and a reducing agent; immersing the substrate in the aqueous solution; and growing the Ag-doped ZnO nanowires on the substrate immersed in the aqueous solution.

A molar concentration of the Zn salt and the reducing agent in the aqueous solution may be in the range of about 0.01 M to about 0.1 M.

Molar concentration of the Ag salt in the aqueous solution may be in the range of about 0.001 M to about 0.005 M.

In the growing of the Ag-doped ZnO nanowires, a temperature of the aqueous solution may be in the range of about 70° C. to about 100° C.

The substrate may be a flexible substrate, a stretchable substrate, or a solid substrate.

Molar concentration of Ag salt in the aqueous solution may be in the range of about 0.005 M to about 0.1 M, and the method may further include performing a heat treatment on the grown Ag-doped ZnO nanowires.

The heat treatment may be performed at a temperature of about 400° C. to about 600° C.

In the growing of the Ag-doped ZnO nanowires, the temperature of the aqueous solution may be in the range of about 80° C. to about 110° C.

The substrate may include semiconductor, nonconductor, metal, or polymer.

The method may further include forming a seed layer for growth of the ZnO nanowires on the substrate.

The seed layer may include ZnO and may be formed by a dipping method.

The forming of the seed layer may include immersing the substrate in an aqueous solution of zinc acetate and drawing the substrate out of the aqueous solution and keeping the substrate in the air at a predetermined temperature, and a molar concentration of the zinc acetate may be between about 0.001 M and about 0.005 M, and the substrate may be kept in the air at a temperature of about 100° C. to about 200° C.

The seed layer may include Zn or gold (Au).

The Ag salt may include silver nitrate (AgNO3).

The Zn salt may include zinc nitrate (ZnNO3).

The reducing agent may include Hexamethlylenetetramine (HMTA).

According to an aspect of another embodiment, there is provided a method of manufacturing an energy conversion device, the method including: preparing a first substrate having a first electrode formed thereon; growing silver (Ag)-doped zinc oxide (ZnO) nanowires on the first electrode by using a low-temperature hydrothermal synthesis method using an Ag-containing aqueous solution; and preparing a second substrate having a second electrode formed thereon on the grown Ag-doped ZnO nanowires.

BRIEF DESCRIPTION OF THE DRAWINGS

The above and/or other aspects will become apparent and more readily appreciated from the following description of the embodiments, taken in conjunction with the accompanying drawings of which.

DETAILED DESCRIPTION

Figure 1:
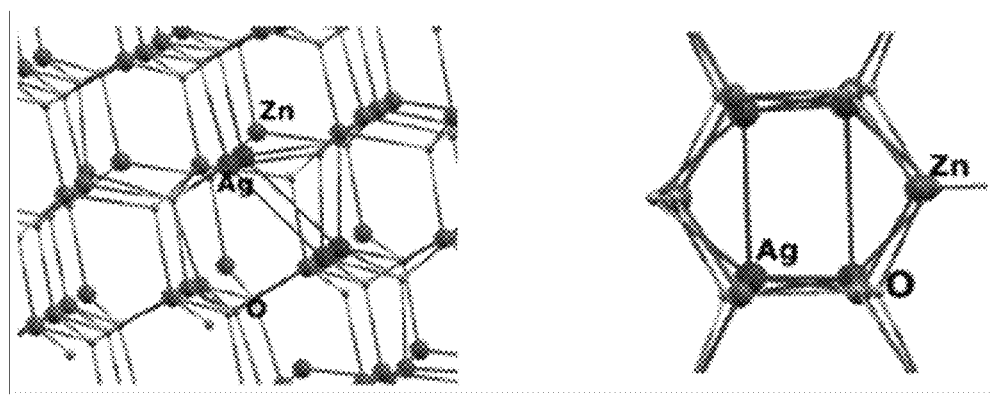
FIG. 1 illustrates a crystal structure of zinc oxide (ZnO) nanowires doped with silver (Ag)

Reference will now be made in detail to embodiments, examples of which are illustrated in the accompanying drawings, wherein like reference numerals refer to like elements throughout. In the drawings, the dimensions or thicknesses of layers and regions may be exaggerated for clarity.

Elements in Groups I and V may be used as doping materials so that zinc oxide (ZnO) shows p-type semiconductor characteristics. That is, ZnO has p-type properties by replacing Zn and O with Group I and V elements, respectively. Until recently, much research has been conducted into group V elements such as nitrogen (N), phosphorous (I), arsenic (As) as p-type impurities. However, the acceptor level of these elements are so high that they are difficult to achieve high hole density and mobility, and high temperature heat treatment needs to be performed for activation of doping materials. The Group V elements also lack reproducibility and continue to degrade p-type characteristics after doping.

Silver (Ag) in Group I is replaced with Zn to form a low acceptor level. Furthermore, since silver oxide (AgO) has a similar Wuruzite crystal structure to ZnO, it has similar bond distance and lattice constant to ZnO. For example, AgO has an a-axis lattice constant of 3.287 Å and a c-axis lattice constant of 5.307 Å while ZnO has an a-axis lattice constant of 3.555 Å and a c-axis lattice constant of 5.908 Å. Due to its similar crystal structure to ZnO, AgO may be stably used for p-type doping without significantly affecting the morphologies of ZnO nanostructures.

Figure 2:
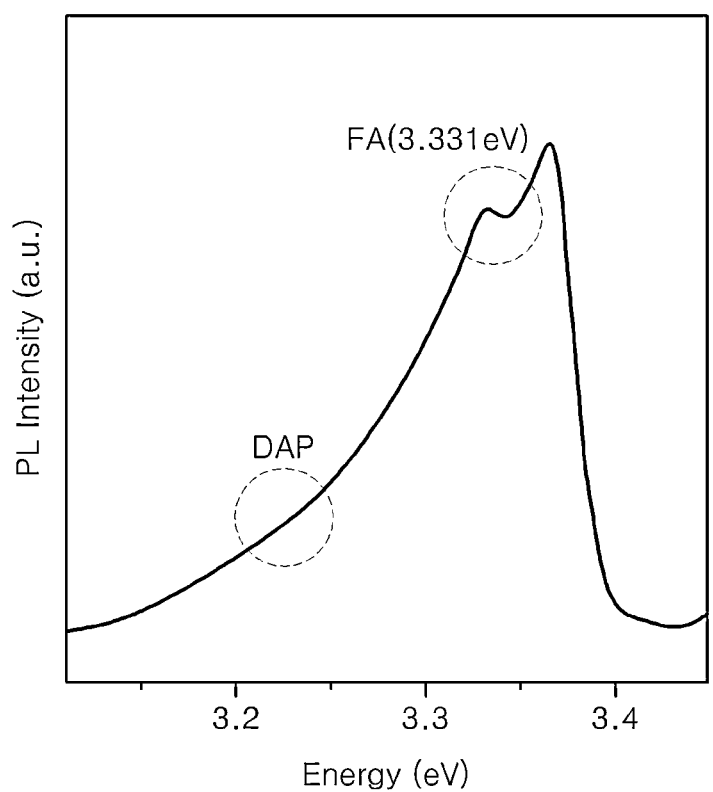
FIG. 2 illustrates a photoluminescence (PL) characteristic curve of Ag-doped ZnO nanowires.

FIG. 1 illustrates a crystal structure of Ag-doped ZnO nanowires. FIG. 2 illustrates a photoluminescence (PL) characteristic curve of Ag-doped ZnO nanowires. In FIG. 2, DAP and FA denote a peak related to Doner-Acceptor pair and a peak related to free electron to acceptor level transition, respectively. As evident from the PL characteristic curve, the Ag-doped ZnO nanowires show p-type characteristics.

A method of manufacturing an energy conversion device including Ag-doped p-type ZnO nanowires according to an exemplary embodiment will now be described in detail with reference to FIGS. 3 through 8.

Figure 3:
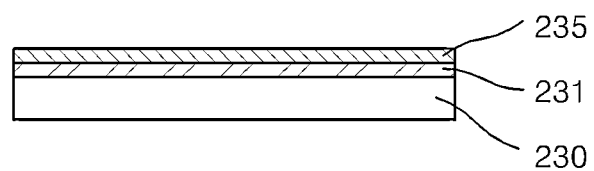
FIGS. 3 through 8 are diagrams for explaining a method of manufacturing an energy conversion device including Ag-doped ZnO nanowires according to an exemplary embodiment.
Figure 4:
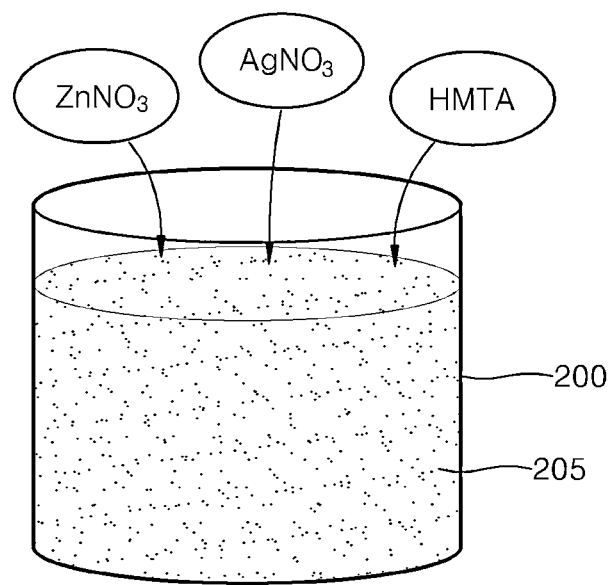

Referring to FIG. 3, a first substrate 230 on which a first electrode 231 is formed is prepared. The first electrode 231 may be formed by depositing a conductive material over the first substrate 230. For example, the first substrate 230 may be a flexible substrate such as a plastic substrate, a stretchable substrate, or a solid substrate. The solid substrate may include a semiconductor material like gallium nitride (GaN) or sapphire, non-conductor, or metal. The first electrode 231 may include Indium Tin Oxide (ITO), Gallium Tin Oxide (GTO), Poly (3,4-ethylenedioxythiophene) (PEDOT), or metal. However, they are not limited thereto and may include various other materials.

Prior to performing low-temperature hydrothermal synthesis as described below, the method may further include forming a seed layer 235 that facilitates the growth of ZnO nanowires on the first electrode 231. The seed layer 235 may include ZnO. In this case, the seed layer 235 may be formed by using a low-temperature dipping method. More specifically, an aqueous solution of zinc acetate is prepared, and the first substrate 230 having the first electrode 231 formed thereon is immersed in the aqueous solution. For example, a molar concentration of zinc acetate in the aqueous solution may be in the range of about 0.001 M to about 0.005 M. Subsequently, the first substrate 230 is taken out of the aqueous solution and kept in the air at temperature of about 100° C. to about 200° C. Thereafter, the seed layer 235 including ZnO is formed on the first electrode 231 of the first substrate 230. The seed layer 235 may contain Zn or gold (Au). In this case, the seed layer 235 may be formed by depositing Zn or Au on the first electrode 231. The seed layer 235 may not necessarily be formed on the first electrode 231. That is, without the need for forming the seed layer 235, Ag-doped ZnO nanowires may be grown on the first electrode 231 by using the low-temperature hydrothermal synthesis.

Figure 5:
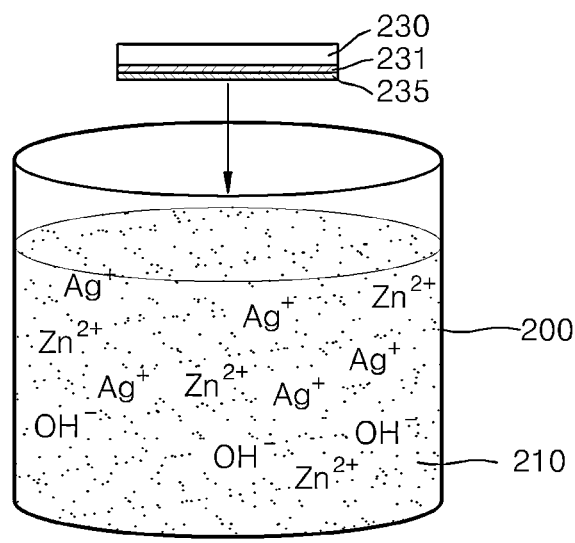

Next, Ag-doped ZnO nanowires 250 are grown on the seed layer 235 by using the low-temperature hydrothermal synthesis. More specifically, referring to FIG. 4, an aqueous solution (210 in FIG. 5) containing Ag dopants is prepared by mixing Ag salt, zinc salt, and a predetermined reducing agent with a predetermined solvent 205 in a reaction vessel 200. For example, the Ag salt may include silver nitrate (AgNO3), and the Zn salt may include zinc nitrate (ZnNO3). The reducing agent may contain Hexamethlylenetetramine (HMTA). However, they are not limited thereto, and may include other various materials. In this case, the molar concentration of the Zn salt and the reducing agent in the aqueous solution 210 may be in the range of about 0.01 M to about 0.1 M. The molar concentration of the Ag salt containing the dopants in the aqueous solution 210 may be in the range of about 0.001 M to about 0.005 M. Thus, as illustrated in FIG. 5, Ag+ and Zn2+ ions and hydroxide ions (OH−) are dispersed in the aqueous solution 210. Referring to FIG. 5, for a subsequent process, the first substrate 230 having the seed layer 235 and the first electrode 231 formed thereon is immersed in the aqueous solution 210 including the Ag salt, the Zn salt, and the reducing agent.

Figure 6:
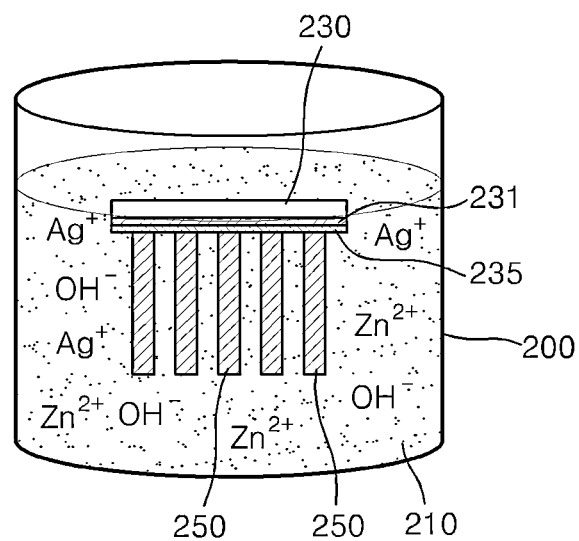
Figure 7:
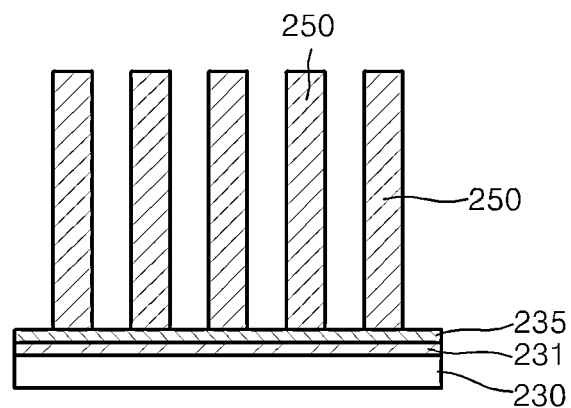
Figure 8:
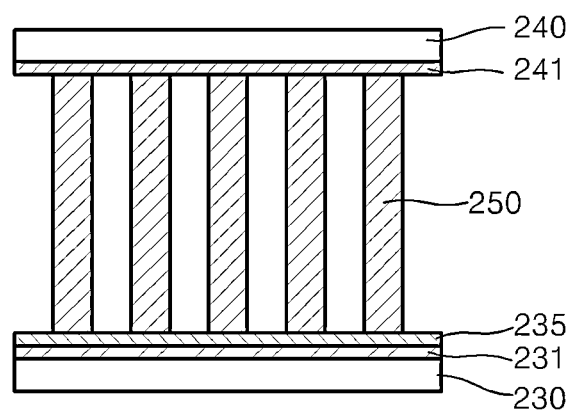

Referring to FIG. 6, when the aqueous solution 210 is maintained at temperature of about 70° C. to about 100° C. with the first substrate 230 immersed therein, the Ag-doped ZnO nanowires 250 are grown on the seed layer 235 of the first substrate 230. The growth direction or shape of the Ag-doped ZnO nanowires 250 may be adjusted according to growth conditions. Referring to FIG. 7, the Ag-doped ZnO nanowires 250 grown on the first substrate 230 is drawn out of the reaction vessel 200 and then kept at room temperature. Thus, the Ag-doped ZnO nanowires 250 having improved p-type characteristics may be obtained. Referring to FIG. 8, a second substrate 240 having a second electrode 241 formed on the Ag-doped ZnO nanowires 250 is prepared, thereby completing an energy conversion device using a piezoelectric effect of the ZnO nanowires 250. In this case, like the first substrate 230, the second substrate 240 may be a flexible substrate, a stretchable substrate, or a solid substrate. Like the first electrode 231, for example, the second electrode 241 may include ITO, GTO, PEDOT, or metal.

Figure 9:
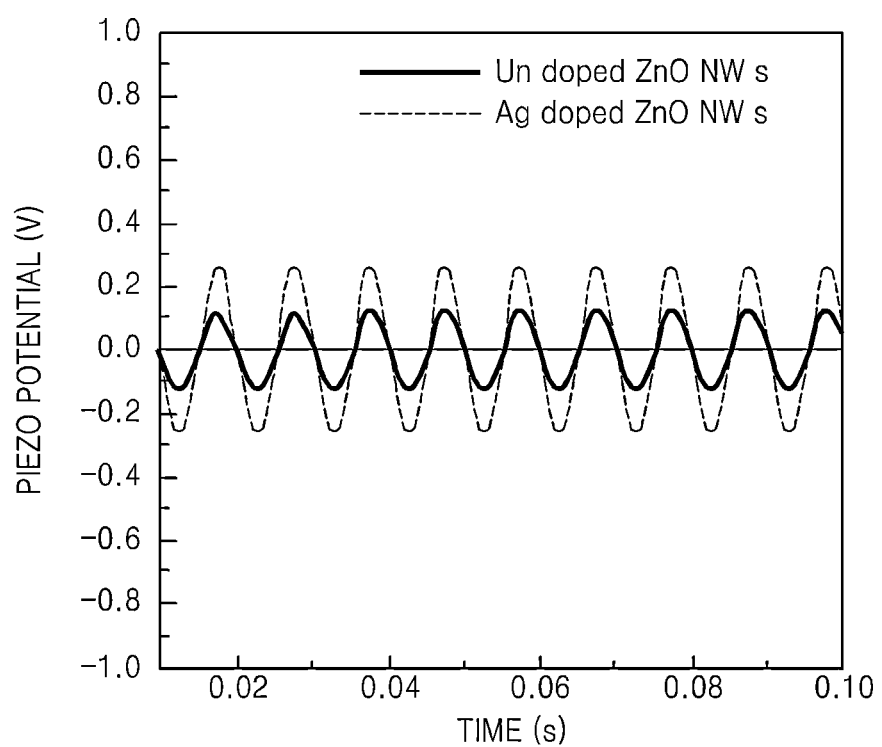
FIG. 9 illustrates output voltages of an energy conversion device including Ag-doped ZnO nanowires and an energy conversion device including undoped ZnO nanowires when a 100 Hz sound is generated at 90 dB.

FIG. 9 illustrates output voltages of an energy conversion device including Ag-doped ZnO nanowires and an energy conversion device including undoped ZnO nanowires when a 100 Hz sound is generated at 90 dB.

Figure 10A:
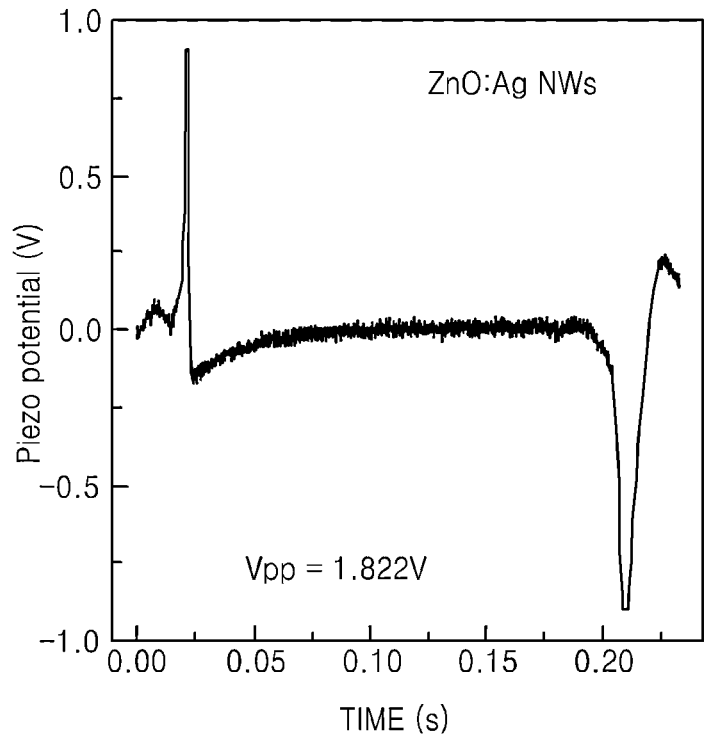
FIGS. 10A and 10B output voltages of an energy conversion device including Ag-doped ZnO nanowires and an energy conversion device including undoped ZnO nanowires when 1 Newton of force is applied and removed.
Figure 10B:
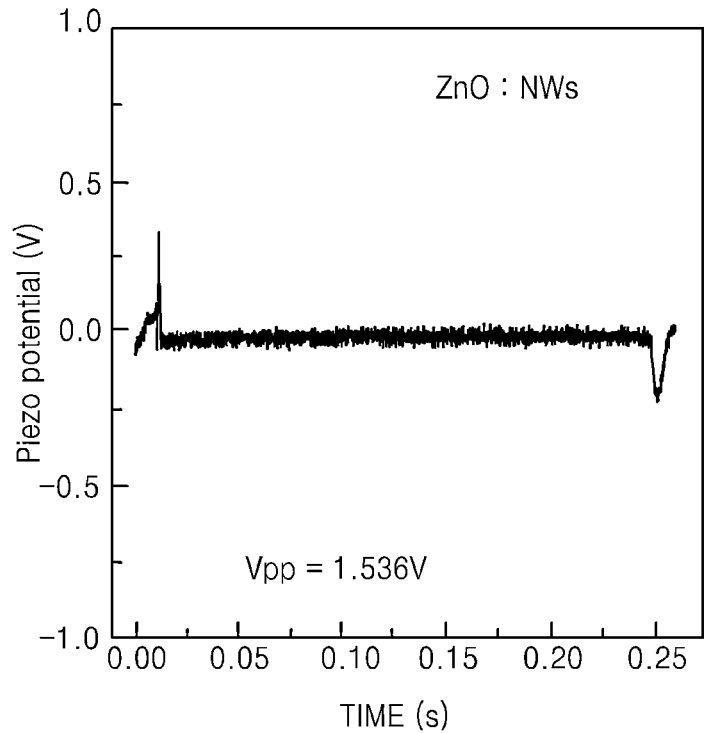

Referring to FIG. 9, it is observed that the energy conversion device including the Ag-doped ZnO nanowires grown by the above-described process has an output voltage that is about twice an output voltage of the energy conversion device including undoped ZnO nanowires. FIGS. 10A and 10B illustrate output voltages of an energy conversion device including Ag-doped ZnO nanowires and an energy conversion device including undoped ZnO nanowires when 1 Newton of force is applied and removed. In FIGS. 10A and 10B, Vpp denotes an output voltage corresponding to a peak to peak piezo potential. It is seen from the graphs of FIGS. 10A and 10B that an output voltage of the energy conversion device including the Ag-doped ZnO nanowires is approximately 3.4 times higher than an output voltage of the energy conversion device including the undoped ZnO nanowires.

As described above, by adjusting the molar concentration of Ag salt in the aqueous solution to a value from about 0.001 M to about 0.005 M, the energy conversion device may be manufactured without using a subsequent high temperature process. The method allows easy fabrication of an energy conversion device using a solid substrate or a flexible, heat-vulnerable substrate such as a plastic substrate. Thus, it is possible to realize an energy conversion device that obtains energy from the ambient environment. An energy conversion device including Ag-doped ZnO nanowires generates higher output voltages than an energy conversion device including undoped ZnO nanowires. Due to their high efficiency energy conversion and stable voltage output, energy conversion devices manufactured using the above-described method may be used as energy sources that are attached to clothing or body parts, or be applied to the field of sensors for detecting pressure. While it has been described above that an energy conversion device is manufactured by growing Ag-doped ZnO nanowires on a first electrode of a first substrate, the Ag-doped ZnO nanowires may be grown directly on the first substrate.

FIGS. 11 through 14 are diagrams for explaining a method of manufacturing an energy conversion device including Ag-doped ZnO nanowires according to another exemplary embodiment. Only the difference from the previous embodiment is now described with reference to FIGS. 11 through 14.

Figure 11:
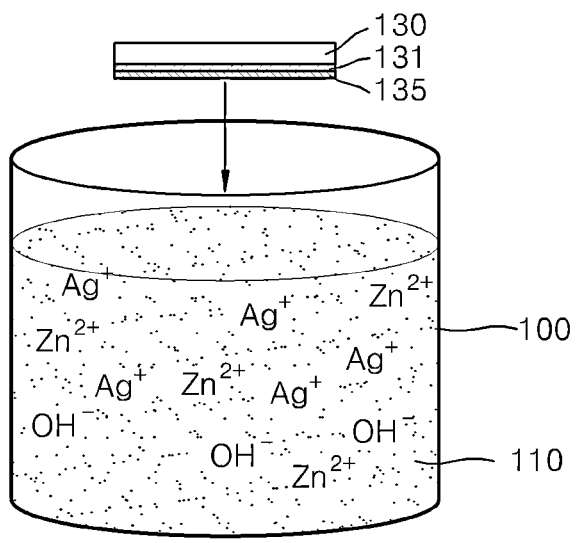
FIGS. 11 through 14 are diagrams for explaining a method of manufacturing an energy conversion device including Ag-doped ZnO nanowires according to another exemplary embodiment.

Referring to FIG. 11, a first substrate 130 having a first electrode 131 formed thereon is prepared. For example, the first substrate 130 may include a semiconductor material like GaN or sapphire, non-conductor, metal, or polymer. The first electrode 131 may include ITO, GTO, PEDOT, or metal.

The method may further include forming a seed layer 135 that facilitates the growth of ZnO nanowires on the first electrode 131. The seed layer 135 may include ZnO, Zn, or Au. Since the process of forming the seed layer 135 has been described above, a detailed description thereof will be omitted herein. The seed layer 135 may not necessarily be formed on the first electrode 131. That is, without the need for forming the seed layer 135, Ag-doped ZnO nanowires may be grown on the first electrode 131 by using a low-temperature hydrothermal synthesis method.

Ag-doped ZnO nanowires are grown on the seed layer 135 by using the low-temperature hydrothermal synthesis method. More specifically, an aqueous solution 110 containing Ag dopants is prepared by mixing Ag salt, zinc salt, and a predetermined reducing agent with a predetermined solvent 105 in a reaction vessel 100. For example, the Ag salt may include AgNO3, and the Zn salt may include ZnNO3. The reducing agent may contain HMTA. In this case, the molar concentration of the Zn salt and the reducing agent in the aqueous solution 110 may be in the range of about 0.01 M to about 0.1 M. The molar concentration of the Ag salt containing the dopants may be in the range of about 0.005 M to about 0.1 M. Thus, as illustrated in FIG. 11, Ag+, Zn2+, and OH− ions are dispersed in the aqueous solution 110. For a subsequent process, the first substrate 130 having the seed layer 135 and the first electrode 131 formed thereon is immersed in the aqueous solution 110 including the Ag salt, the Zn salt, and the reducing agent.

Figure 12:
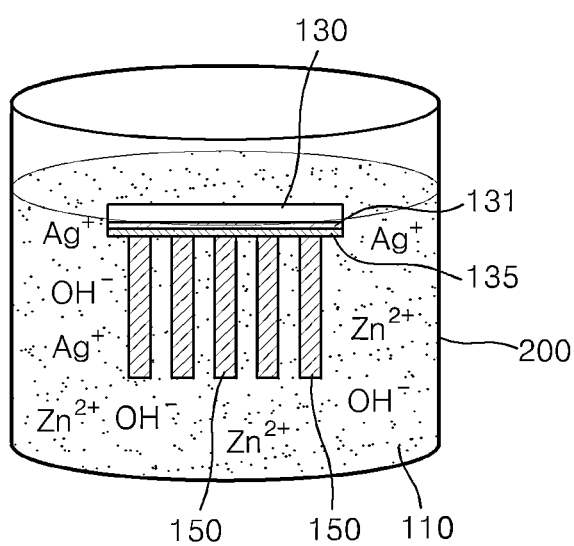
Figure 13:
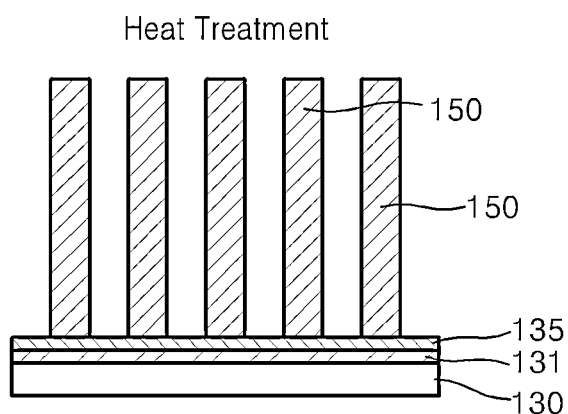

Referring to FIG. 12, when the aqueous solution 110 is maintained at temperature of about 80° C. to about 110° C. with the first substrate 130 immersed therein, Ag-doped ZnO nanowires 150 are grown on the seed layer 135 of the first substrate 130. The growth direction or shape of the Ag-doped ZnO nanowires 150 may be adjusted according to growth conditions. Referring to FIG. 13, the Ag-doped ZnO nanowires 150 grown on the first substrate 130 is drawn out of the reaction vessel 200 and is subjected to heat treatment in order to improve p-type characteristics thereof.

The heat treatment is performed at a predetermined temperature in a predetermined gas atmosphere. For example, the heat treatment may be performed at a temperature of about 400° C. to about 600° C. in a gas atmosphere containing oxygen ($O_2$), nitrogen ($N_2$), or argon (Ar). In general, when Ag atoms are replaced by Zn atoms in ZnO, ZnO has p-type characteristics. When Ag atoms are present among Zn atoms, ZnO has n-type characteristics. Thus, when the Ag-doped p-type ZnO nanowires undergo a heat treatment in a predetermined gas atmosphere, Ag atoms may be easily replaced by Zn atoms, and the number of Ag atoms residing among Zn atoms may be reduced, thereby improving p-type characteristics. Furthermore, when they are subjected to a heat treatment in an oxygen atmosphere, oxygen vacancies in the ZnO nanowires 150 may be reduced, thereby further increasing p-type characteristics.

Figure 14:
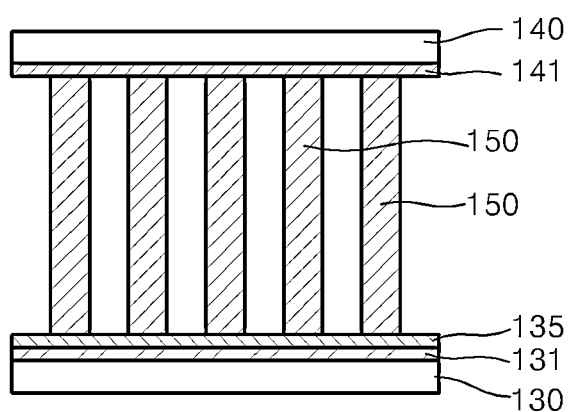

Referring to FIG. 14, after the heat treatment, a second substrate 140 having a second electrode 141 formed on the Ag-doped ZnO nanowires 150 is prepared, thereby completing an energy conversion device using a piezoelectric effect of the ZnO nanowires 150. In this case, the second substrate 140 may include the same material as the first substrate 130, and the second electrode 141 may include the same material as the first electrode 131.

As described above, when the molar concentration of Ag salt in the aqueous solution 110 is adjusted to a value from about 0.005 M to about 0.1 M, a subsequent heat treatment in the temperature range of about 400° C. to about 600° C. is required to improve p-type characteristics of the ZnO nanowires.

As described above, according to the one or more of the above embodiments, Ag-doped p-type ZnO nanowires may be manufactured by using hydrothermal synthesis that is a low-temperature wet growth method using a Ag containing aqueous solution. Since adjustment of a concentration of Ag in the aqueous solution eliminates the need for a post high temperature process, it is possible to easily fabricate an energy conversion device using a solid substrate or a flexible, heat-vulnerable substrate such as a plastic substrate. Thus, it is also possible to realize an energy conversion device which obtains energy from the ambient environment. An energy conversion device including Ag-doped ZnO nanowires may generate higher output voltages than an energy conversion device including undoped ZnO nanowires. Due to their high efficiency energy conversion and stable voltage output characteristics, energy conversion devices manufactured using the above-described methods may be used as energy sources that are attached to clothing or body parts, or be applied to the field of sensors for detecting pressure.

It should be understood that the exemplary embodiments described therein should be considered in a descriptive sense only and not for purposes of limitation. Descriptions of features or aspects within each embodiment should typically be considered as available for other similar features or aspects in other embodiments.

While the exemplary embodiments have been particularly shown and described, it will be understood by those of ordinary skill in the art that various changes in form and details may be made therein without departing from the spirit and scope of the inventive concept as defined by the following claims.

What is claimed is:

1. A method of manufacturing silver (Ag)-doped zinc oxide (ZnO) nanowires, the method comprising growing the Ag-doped ZnO nanowires on a substrate by a low temperature hydrothermal synthesis method using an Ag-containing aqueous solution.

2. The method of claim 1, wherein the growing the Ag-doped nanowires comprises:
   preparing the aqueous solution containing Ag salt, Zn salt, and a reducing agent;
   immersing the substrate in the aqueous solution; and
   growing the Ag-doped ZnO nanowires on the substrate immersed in the aqueous solution.

3. The method of claim 2, wherein a molar concentration of the Zn salt and the reducing agent in the aqueous solution is in a range of about 0.01 M to about 0.1 M.

4. The method of claim 2, wherein a molar concentration of the Ag salt in the aqueous solution is in a range of about 0.001 M to about 0.005 M.

5. The method of claim 4, wherein in the growing of the Ag-doped ZnO nanowires, a temperature of the aqueous solution is in a range of about 70° C. to about 100° C.

6. The method of claim 4, wherein the substrate is one of a flexible substrate, a stretchable substrate, and a solid substrate.

7. The method of claim 2, wherein a molar concentration of Ag salt in the aqueous solution is in a range of about 0.005 M to about 0.1 M.

8. The method of claim 7, further comprising performing a heat treatment on the grown Ag-doped ZnO nanowires.

9. The method of claim 8, wherein the heat treatment is performed at a temperature of about 400° C. to about 600° C.

10. The method of claim 7, wherein in the growing of the Ag-doped ZnO nanowires, the temperature of the aqueous solution is in a range of about 80° C. to about 110° C.

11. The method of claim 7, wherein the substrate comprises a semiconductor, a non-conductor, a metal, or a polymer.

12. The method of claim 2, further comprising forming a seed layer for growth of the ZnO nanowires on the substrate.

13. The method of claim 12, wherein the seed layer comprises ZnO.

14. The method of claim 13, wherein the seed layer is formed by using a dipping method.

15. The method of claim 14, wherein the forming of the seed layer comprises immersing the substrate in an aqueous solution of zinc acetate and drawing the substrate out of the aqueous solution and keeping the substrate in the air at a predetermined temperature.

16. The method of claim 15, wherein a molar concentration of the zinc acetate is between about 0.001 M and about 0.005 M, and the substrate is kept in the air at a temperature of about 100° C. to about 200° C.

17. The method of claim 12, wherein the seed layer comprises Zn or gold (Au).

18. The method of claim 2, wherein the Ag salt comprises silver nitrate ($AgNO_3$).

19. The method of claim 2, wherein the Zn salt comprises zinc nitrate ($ZnNO_3$).

20. The method of claim 2, wherein the reducing agent comprises Hexamethlylenetetramine (HMTA).

21. Silver (Ag)-doped zinc oxide (ZnO) nanowires manufactured by the method of claim 1.

22. A method of manufacturing an energy conversion device, the method comprising:
   preparing a first substrate having a first electrode formed thereon;
   growing silver (Ag)-doped zinc oxide (ZnO) nanowires on the first electrode by using a low-temperature hydrothermal synthesis method using an Ag-containing aqueous solution; and
   preparing a second substrate, having a second electrode formed thereon, on the grown Ag-doped ZnO nanowires.

23. The method of claim 22, wherein the growing of the Ag-doped ZnO nanowires includes:
   preparing the aqueous solution containing Ag salt, Zn salt, and a reducing agent;
   immersing the first substrate in the aqueous solution; and
   growing the Ag-doped ZnO nanowires on the first electrode of the first substrate immersed in the aqueous solution.

24. The method of claim 23, wherein a molar concentration of the Zn salt and the reducing agent in the aqueous solution is in a range of about 0.01 M to about 0.1 M.

25. The method of claim 23, wherein a molar concentration of the Ag salt in the aqueous solution is in a range of about 0.001 M to about 0.005 M.

26. The method of claim 25, wherein in the growing of the Ag-doped ZnO nanowires, a temperature of the aqueous solution is in a range of about 70° C. to about 100° C.

27. The method of claim 25, wherein each of the first and second substrates is one of a flexible substrate, a stretchable substrate, and a solid substrate.

28. The method of claim 23, wherein a molar concentration of the Ag salt in the aqueous solution is in a range of about 0.005 M to about 0.1 M.

29. The method of claim 28, further comprising performing a heat treatment on the grown Ag-doped ZnO nanowires.

30. The method of claim 29, wherein the heat treatment is performed at a temperature of about 400° C. to about 600° C.

31. The method of claim 28, wherein in the growing of the Ag-doped ZnO nanowires, the temperature of the aqueous solution is in a range of about 80° C. to about 110° C.

32. The method of claim 28, wherein each of the first and second substrates comprises a semiconductor, a non-conductor, a metal, or a polymer.

33. The method of claim 23, wherein each of the first and second electrodes comprises Indium Tin Oxide (ITO), Gallium Tin Oxide (GTO), or Poly(3,4-ethylenedioxythiophene (PEDOT).

34. The method of claim 22, further comprising a seed layer for growth of the ZnO nanowires on the first electrode of the first substrate.

35. The method of claim 34, wherein the seed layer includes ZnO, Zn, or gold (Au).

* * * * *